United States Patent
Sobue et al.

(10) Patent No.: US 11,699,660 B2
(45) Date of Patent: Jul. 11, 2023

(54) SEMICONDUCTOR INTEGRATED CIRCUIT DEVICE

(71) Applicant: SOCIONEXT INC., Kanagawa (JP)

(72) Inventors: Isaya Sobue, Yokohama (JP); Hidetoshi Tanaka, Yokohama (JP); Mai Tsukamoto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 136 days.

(21) Appl. No.: 17/180,094

(22) Filed: Feb. 19, 2021

(65) Prior Publication Data

US 2021/0175172 A1 Jun. 10, 2021

Related U.S. Application Data

(63) Continuation of application No. PCT/JP2018/031774, filed on Aug. 28, 2018.

(51) Int. Cl.
*H01L 23/528* (2006.01)
*H01L 27/02* (2006.01)

(52) U.S. Cl.
CPC ...... *H01L 23/5286* (2013.01); *H01L 27/0292* (2013.01)

(58) Field of Classification Search
CPC ... H01L 21/822; H01L 21/82; H01L 27/0292; H01L 27/0296; H01L 27/04; H01L 23/5286
USPC ........................................................ 257/773
See application file for complete search history.

(56) References Cited

U.S. PATENT DOCUMENTS

| | | | |
|---|---|---|---|
| 2003/0223164 A1* | 12/2003 | Ebara | H01L 27/0266 361/56 |
| 2009/0026503 A1 | 1/2009 | Tsuda | |
| 2013/0224664 A1* | 8/2013 | Kumano | G03F 7/2022 430/312 |
| 2017/0301665 A1* | 10/2017 | Nakanishi | H01L 23/5226 |
| 2019/0051601 A1 | 2/2019 | Hirose et al. | |

FOREIGN PATENT DOCUMENTS

| | | | |
|---|---|---|---|
| JP | H04-312958 A | | 11/1992 |
| JP | H06-077444 A | | 3/1994 |
| JP | 2001223335 | * | 8/2001 |
| JP | 2008-078354 A | | 4/2008 |
| JP | 2009-032908 A | | 2/2009 |

(Continued)

OTHER PUBLICATIONS

International Search Report and Written Opinion issued in International Patent Application No. PCT/JP2018/031774, dated Nov. 27, 2018; with partial English translation.

*Primary Examiner* — Sheng-Bai Zhu

(74) *Attorney, Agent, or Firm* — McDermott Will & Emery LLP

(57) ABSTRACT

A semiconductor integrated circuit device includes a core region and an IO region on a chip. In an IO cell row placed in the IO region, a first power supply line extending in the X direction in a low power supply voltage region has a portion protruding to the core region. A signal IO cell has a reinforcing line that connects a second power supply line extending in the X direction in the low power supply voltage region and a third power supply line extending in the X direction in a high power supply voltage region, the reinforcing line extending in the Y direction in a layer above the second and third power supply lines.

5 Claims, 5 Drawing Sheets

(56) References Cited

FOREIGN PATENT DOCUMENTS

| JP | 2009-049370 A | | 3/2009 |
|----|---------------|---|--------|
| WO | WO 2016203648 | * | 12/2016 |
| WO | 2017/169150 A1 | | 10/2017 |

* cited by examiner

SEMICONDUCTOR INTEGRATED CIRCUIT DEVICE

CROSS-REFERENCE TO RELATED APPLICATIONS

This is a continuation of International Application No. PCT/JP2018/031774 filed on Aug. 28, 2018. The entire disclosure of this application is incorporated by reference herein.

BACKGROUND

The present disclosure relates to a semiconductor integrated circuit device in which a core region and an IO region having an arrangement of input/output (IO) cells are formed.

In the recent semiconductor integrated circuits, as the size becomes finer, the wiring resistance is increasing. Also, reduction in power supply voltage is advancing. For these reasons, there have occurred problems such as reduction in electrostatic discharge (ESD) resistance, destabilization of circuit operation caused by a drop in power supply voltage, and malfunction of the circuit.

Japanese Unexamined Patent Publication No. 2008-78354 discloses a technology of mutually connecting power supply lines (VDD)/grounding lines (VS S) inside IO cells and internal-circuit power supply lines provided in an internal circuit formation portion, for strengthening the power supply lines.

SUMMARY

In the technology of the cited patent, however, wiring resources are required in the core region for both the VDD power supply lines and the VSS power supply lines, resulting in increase in the area of the semiconductor integrated circuit device.

An objective of the present disclosure is providing a configuration of a semiconductor integrated circuit device having an arrangement of IC cells, which can strengthen power supply lines while preventing increase in area.

In one mode of the present disclosure, a semiconductor integrated circuit device includes: a chip; a core region provided on the chip; an IO region provided between the core region and a periphery of the chip on the chip; an IO cell row placed in the IO region, constituted by a plurality of IO cells arranged in a first direction, the first direction being a direction along the periphery of the chip; and power supply lines placed in the IO region, extending in the first direction, wherein the plurality of IO cells each have a low power supply voltage region and a high power supply voltage region separated in a second direction perpendicular to the first direction, the low power supply voltage region being located closer to the core region, the power supply lines includes a first power supply line extending in the first direction in the low power supply voltage region, for supply of a first power supply voltage, a second power supply line extending in the first direction in the low power supply voltage region, for supply of a second power supply voltage, and a third power supply line extending in the first direction in the high power supply voltage region, for supply of the second power supply voltage, the first power supply line has a first portion protruding from the low power supply voltage region to the core region, and a first IO cell as a signal IO cell among the plurality of IO cells has a first reinforcing line extending in the second direction in a wiring layer located above the second and third power supply lines, for mutually connecting the second and third power supply lines.

According to the above mode, the first power supply line for supply of the first power supply voltage has a first portion protruding from the low power supply voltage region of the IO cell to the core region. Having this first portion, the wiring resistance decreases, and thus a drop in power supply voltage can be prevented. Also, the second and third power supply lines for supply of the second power supply voltage are mutually connected by the first reinforcing line provided in a wiring layer located above the second and third power supply lines. Having this first reinforcing line, the power supply lines are strengthened without the need to provide a new power supply line in the core region, and thus a drop in power supply voltage can be prevented.

According to the semiconductor integrated circuit device of the present disclosure, it is possible to strengthen power supply lines while preventing increase in area.

DETAILED DESCRIPTION

Embodiments of the present disclosure will be described hereinafter with reference to the accompanying drawings.

First Embodiment

Figure 1:
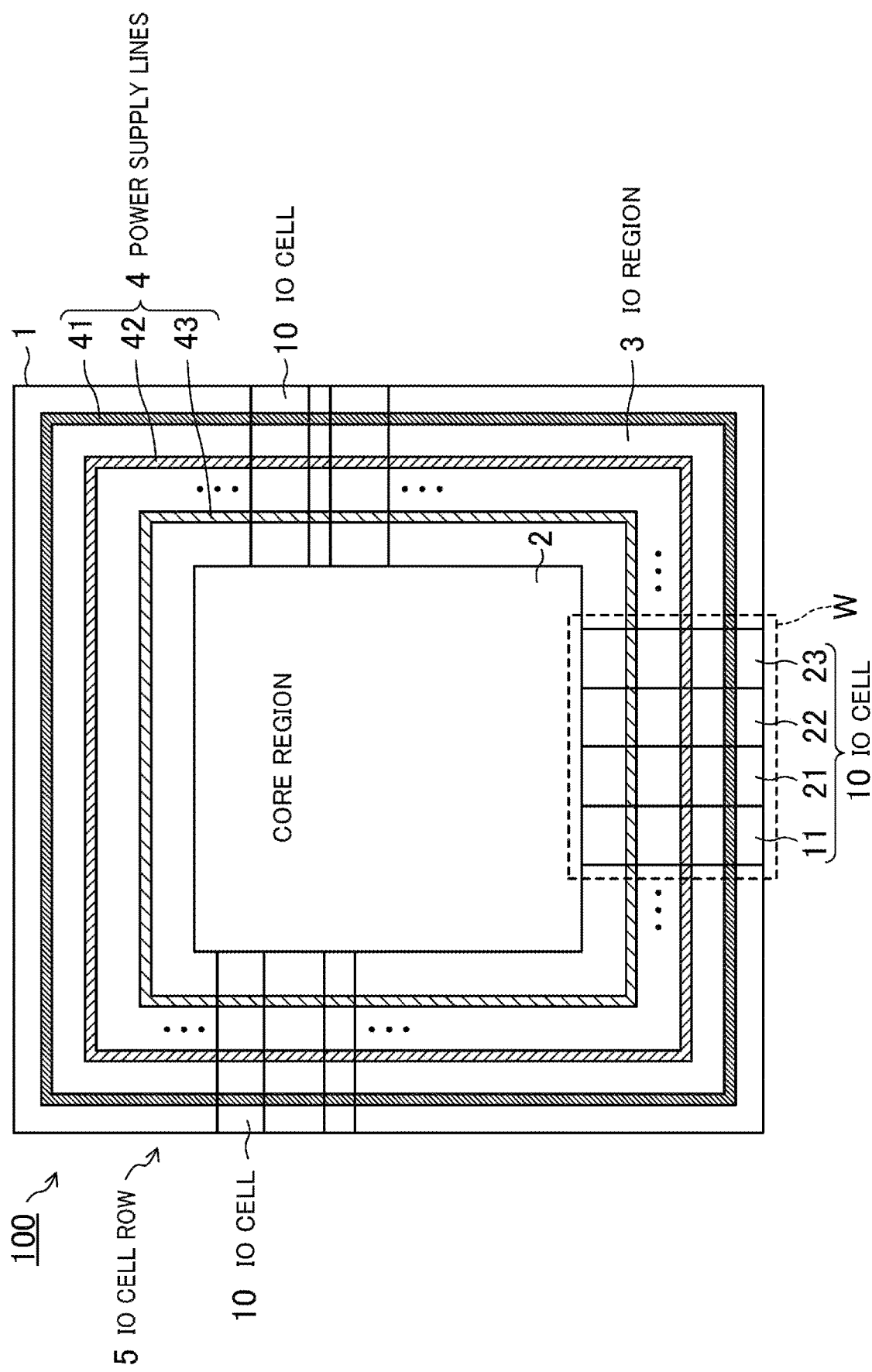
FIG. 1 is a plan view schematically showing the entire configuration of a semiconductor integrated circuit device according to an embodiment.

FIG. 1 is a plan view schematically showing the entire configuration of a semiconductor integrated circuit device (semiconductor chip) according to an embodiment. The semiconductor integrated circuit device 100 shown in FIG. 1 has, on a chip 1, a core region 2 in which internal core circuits are formed and an IO region 3 in which interface circuits (IO circuits) are formed. The IO region 3 is provided around the core region 2. In the IO region 3, an IO cell row 5 is provided along the periphery of the chip 1. Although illustration is omitted in FIG. 1, in the IO cell row 5, a plurality of IO cells 10 constituting interface circuits are arranged in a line.

The IO cells 10 include signal IO cells 11 for input, output, or input/output of signals, IO power supply IO cells 21 for supply of power (power supply voltage VDDIO) mainly to the IO region 3, and VSS IO cells 22 for supply of the grounding potential (power supply voltage VSS), and core power supply IO cells 23 for supply of power (power supply voltage VDD) mainly to the core region 2. VDDIO is higher than VDD: e.g., VDDIO is 3.3 V and VDD is 1.0 V. As used herein, the IO power supply IO cells, the VSS IO cells, and core power supply IO cells are collectively called the power supply IO cells as appropriate.

In the IO region 3, power supply lines 4 are provided extending in the direction in which the IO cells 10 line up. In the illustrated example, the power supply lines 4 include a power supply line 41 for supply of VSS, a power supply line 42 for supply of VDDIO, and a power supply line 43 for supply of VDD. Although the power supply lines 41, 42, and 43 are each illustrated as one line in FIG. 1, each of them may actually be constituted by a plurality of lines as will be described later. Also, although illustration is omitted in FIG. 1, a plurality of external connection pads are placed in the semiconductor integrated circuit device 100.

Figure 2:
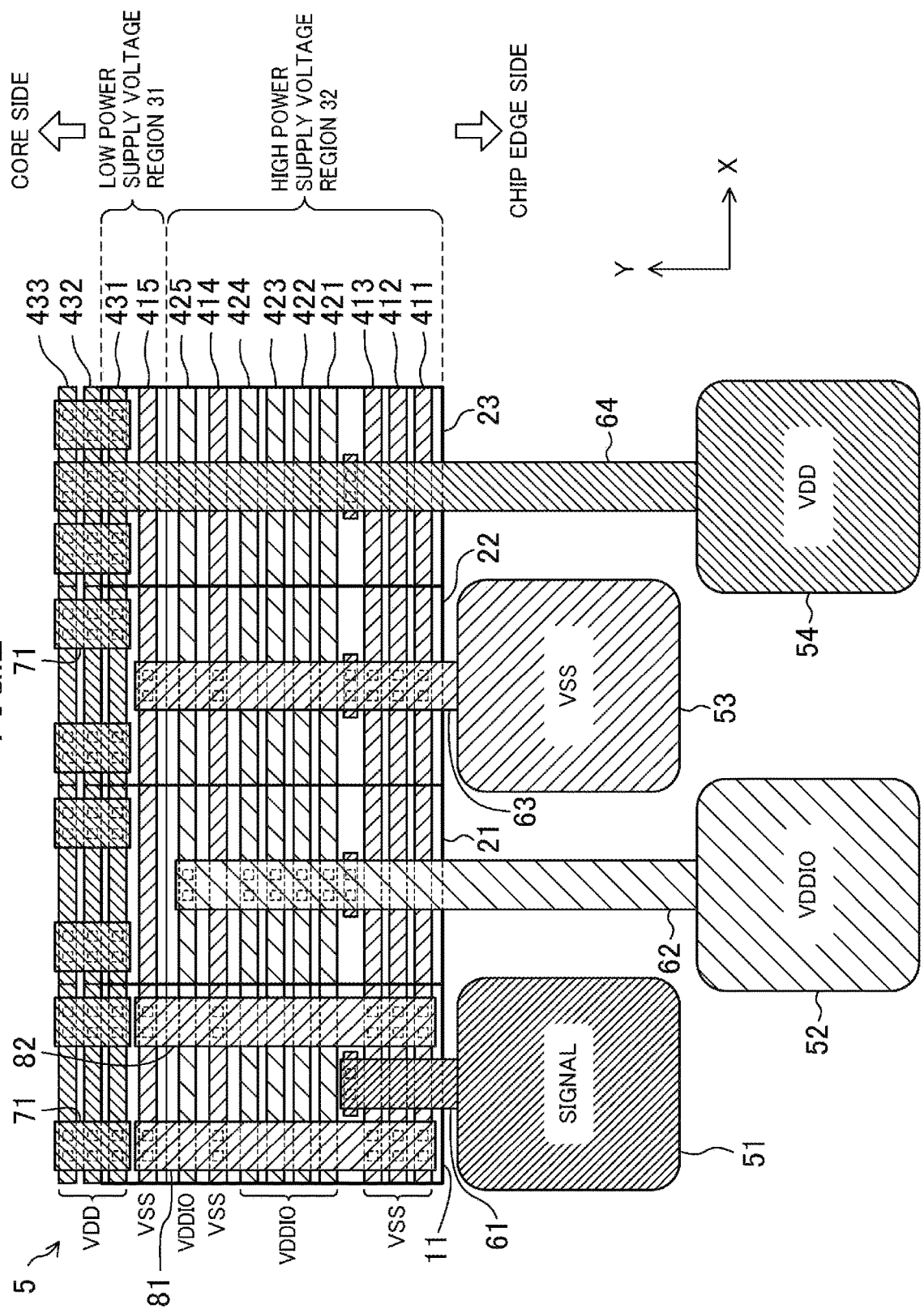
FIG. 2 is a plan view showing a configuration example of an IO region in the first embodiment.

FIG. 2 is a plan view showing a configuration example of the IO region 3 of the semiconductor integrated circuit device 100 according to this embodiment, which corresponds to an enlarged view of part W in FIG. 1. In FIG. 2, illustration is omitted for the internal configuration of the IO cells 10, signal lines, etc. Also, different hatch patterns are used for power supply lines for supply of VDDIO, power supply lines for supply of VSS, and power supply lines for supply of VDD. This also applies to the subsequent plan views.

In FIG. 2, the IO cell row 5 includes a plurality of IO cells 10, specifically, the signal IO cell 11 and the power supply IO cells, i.e., the IO power supply IO cell 21, the VSS IO cell 22, and the core power supply IO cell 23, arranged in the X direction (the horizontal direction as viewed from the figure; the direction along the periphery of the chip 1, which corresponds to the first direction). In the illustrated example, the IO cells are the same in height, i.e., size in the Y direction (the vertical direction as viewed from the figure, which corresponds to the second direction perpendicular to the first direction).

The signal IO cell 11 includes circuits required to exchange signals with the outside of the semiconductor integrated circuit 100 or with the core region 2, such as a level shifter circuit, an output buffer circuit, and an ESD protection circuit, for example. The IO power supply IO cell 21, the VSS IO cell 22, and the core power supply IO cell 23 are for supplying power fed to the external connection pads to the inside of the semiconductor integrated circuit device 100, which include an ESD protection circuit.

An IO cell generally has: a high power supply voltage region including an ESD protection circuit and an output buffer for outputting a signal to the outside of the semiconductor integrated circuit device; and a low power supply voltage region including a circuit for inputting/outputting a signal to the inside of the semiconductor integrated circuit device. The IO cells 10 in FIG. 2 are each divided in the Y direction into a low power supply voltage region 31 on the core region side and a high power supply voltage region 32 on the chip edge side.

A plurality of power supply lines extend in the X direction in the region of the IO cell row 5. Specifically, provided are power supply lines 411, 412, 413, 414, and 415 constituting the power supply line 41 for supply of VSS, power supply lines 421, 422, 423, 424, and 425 constituting the power supply line 42 for supply of VDDIO, and power supply lines 431, 432, and 433 constituting the power supply line 43 for supply of VDD. In the low power supply voltage region 31, provided are the power supply lines 431 to 433 (corresponding to the first power supply line) for supply of VDD (corresponding to the first power supply voltage) and the power supply line 415 (corresponding to the second power supply line) for supply of VSS (corresponding to the second power supply voltage). In the high power supply voltage region 32, provided are the power supply lines 411 to 414 (corresponding to the third power supply line) for supply of VSS and the power supply lines 421 to 425 (corresponding to a fourth power supply line) for supply of VDDIO (corresponding to a third power supply voltage).

The power supply lines 432 and 433 for supply of VDD are provided in a location protruding from the low power supply voltage region 31 to the core region 2. In other words, the power supply line 43 for supply of VDD has a portion (the power supply lines 432 and 433) protruding from the low power supply voltage region 31 to the core region 2. Transistors, wiring lines, etc. to be placed in the core region 2 may be placed under the power supply lines 432 and 433. That is, the portion protruding from the low power supply voltage region 31 to the core region 2 may overlap transistors placed in the core region 2 as viewed from top. Otherwise, space provided between the core region 2 and the IO cell row 10 may lie under the power supply lines 432 and 433.

External connection pads 51, 52, 53, and 54 are provided. The external connection pad 51, which is for signal input/output, is connected with the signal IO cell 11 through a line 61 extending in the Y direction. The external connection pad 52, which is for VDDIO, is connected with the IO power supply IO cell 21 through a line 62 extending in the Y direction. The external connection pad 52 is also connected with the power supply lines 421 to 425 through the line 62. The external connection pad 53, which is for VSS, is connected with the VSS IO cell 22 through a line 63 extending in the Y direction. The external connection pad 53 is also connected with the power supply lines 411 to 415 through the line 63. The external connection pad 54, which is for VDD, is connected with the core power supply IO cell 23 through a line 64 extending in the Y direction. The external connection pad 54 is also connected with the power supply lines 431 to 433 through the line 64.

Reinforcing lines 81 and 82 (corresponding to the first reinforcing line) that mutually connect the power supply lines 411 to 415 are provided in the signal IO cell 11 (corresponding to the first IO cell). The reinforcing lines 81 and 82 extend in the Y direction in a wiring layer located above the power supply lines 411 to 415. The thickness of the reinforcing lines 81 and 82 is preferably greater than that of the power supply lines 411 to 415.

Also, the power supply lines 431 to 433 are mutually connected by reinforming lines 71 (corresponding to a second reinforcing line) extending in the Y direction. The reinforcing lines 71 extend in the Y direction in a wiring layer located above the power supply lines 431 to 433. The thickness of the reinforcing lines 71 is preferably greater than that of the power supply lines 431 to 433.

It is herein assumed that the power supply lines 411 to 415, 421 to 425, and 431 to 433 extending in the X direction are provided in the same wiring layer. It is also assumed that the lines 61 to 64, 71, 81, and 82 extending in the Y direction are located above the power supply lines 411 to 415, 421 to 425, and 431 to 433 extending in the X direction and are in the same wiring layer.

The configuration according to this embodiment has the following features.

For the VDD power supply lines, the power supply lines 432 and 433 for supply of VDD are provided in a location protruding from the low power supply voltage region 31 to the core region 2. Also, the power supply lines 431 to 433 for supply of VDD are mutually connected by the reinforcing lines 71 extending in the Y direction. This strengthens the VDD power supply lines and can reduce the resistance value of the VDD power supply lines. It is therefore possible to prevent a drop in power supply voltage and improve the ESD resistance.

Note that during designing the power supply lines 432 and 433 may be considered as lines belonging to the IO cells. In this case, with no need to provide lines separately, the design man-hour can be reduced. Alternatively, the power supply lines 432 and 433 may be considered as lines not-belonging to the IO cells and separately placed during designing. In this case, since the line width can be adjusted as needed, the design flexibility will improve.

For the VSS power supply lines, the power supply line 415 is placed in the low power supply voltage region 31 and the power supply lines 411 to 414 are placed in the high power supply voltage region 32. Also, in the signal IO cell 11, the reinforcing lines 81 and 82 are provided to mutually connect the power supply lines 411 to 415. This strengthens the VSS power supply lines and can reduce the resistance value of the VSS power supply lines. It is therefore possible to prevent a drop in power supply voltage and improve the ESD resistance. Moreover, this strengthening of the VSS power supply lines is achieved without the need to provide a new VSS power supply line in the core region. It is therefore possible to prevent increase in the area of the semiconductor integrated circuit device.

Figure 3:
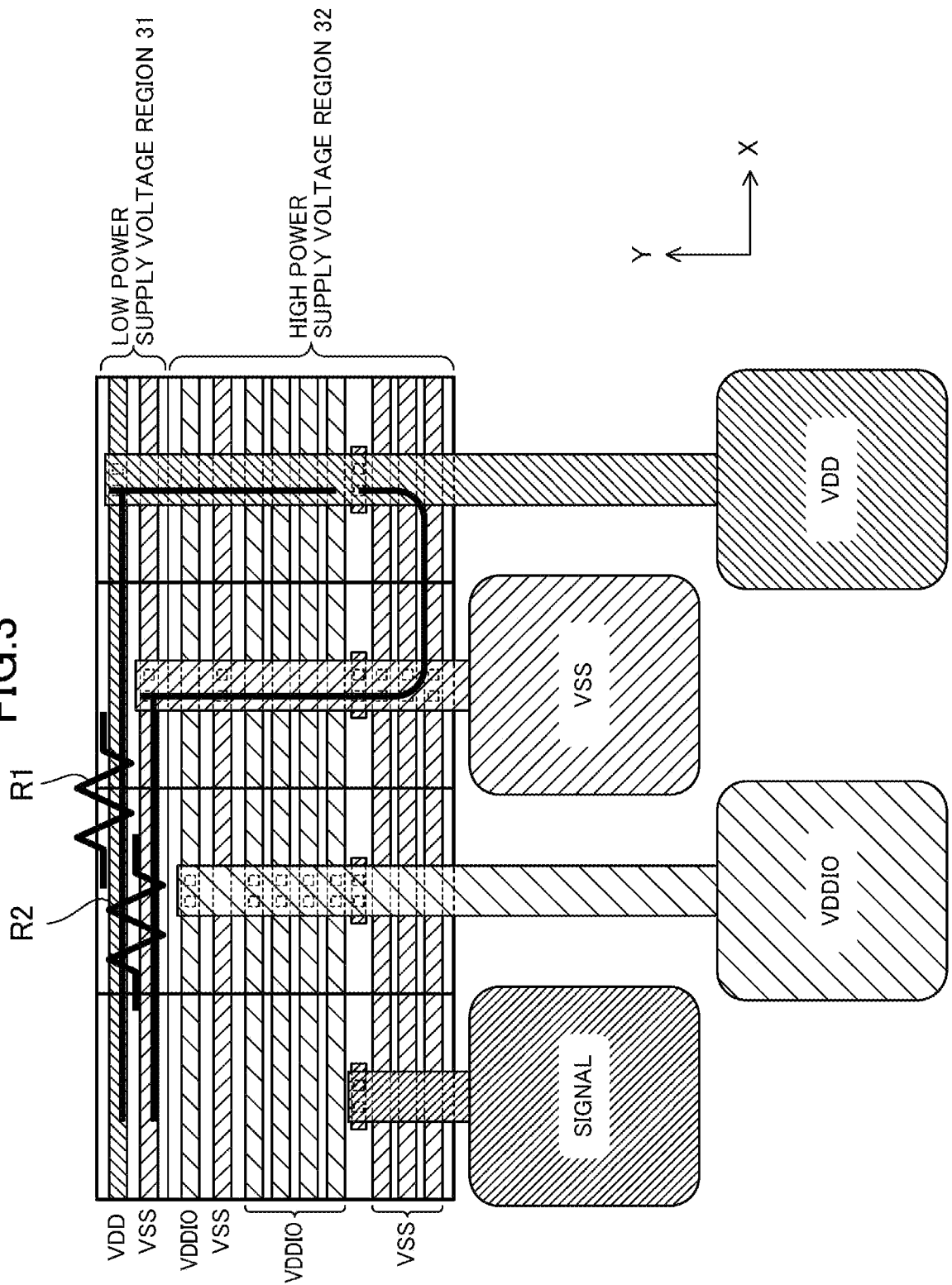
FIG. 3 is a plan view showing a comparative example.

FIG. 3 is a plan view of a comparative example of this embodiment, showing a configuration in which the power supply lines 432 and 433 for supply of VDD, the reinforcing lines 71, and the reinforcing lines 81 and 82 in the signal IO cell 11 are omitted from the configuration of FIG. 2. It is herein assumed that an ESD protection circuit is placed in the high power supply voltage region 32 of the core power supply IO cell 23. It is preferable that the power supply line resistance from a core transistor to the ESD protection circuit be as low as possible. As the power supply line resistance is lower, the VDD-VSS potential difference during ESD can be held to a smaller value, and thus the ESD resistance of the core transistor can be improved.

In the configuration of FIG. 3, however, a VDD power supply line resistance R1 and a VSS power supply line resistance R2 from the core transistor to the ESD protection circuit are high. To reduce the power supply line resistances R1 and R2, a VDD power supply cell and a VSS power supply cell must be placed immediately adjacent to a signal cell. To do this, however, a number of VDD power supply cells and VSS power supply cells must be placed, which causes increase in the size of the IO region.

In contrast to the above, according to this embodiment, where both the VDD power supply lines and the VSS power supply lines are reinforced, it is unnecessary to place a number of VDD power supply cells and VSS power supply cells. Thus, increase in the size of the IO region can be prevented.

Second Embodiment

Figure 4:
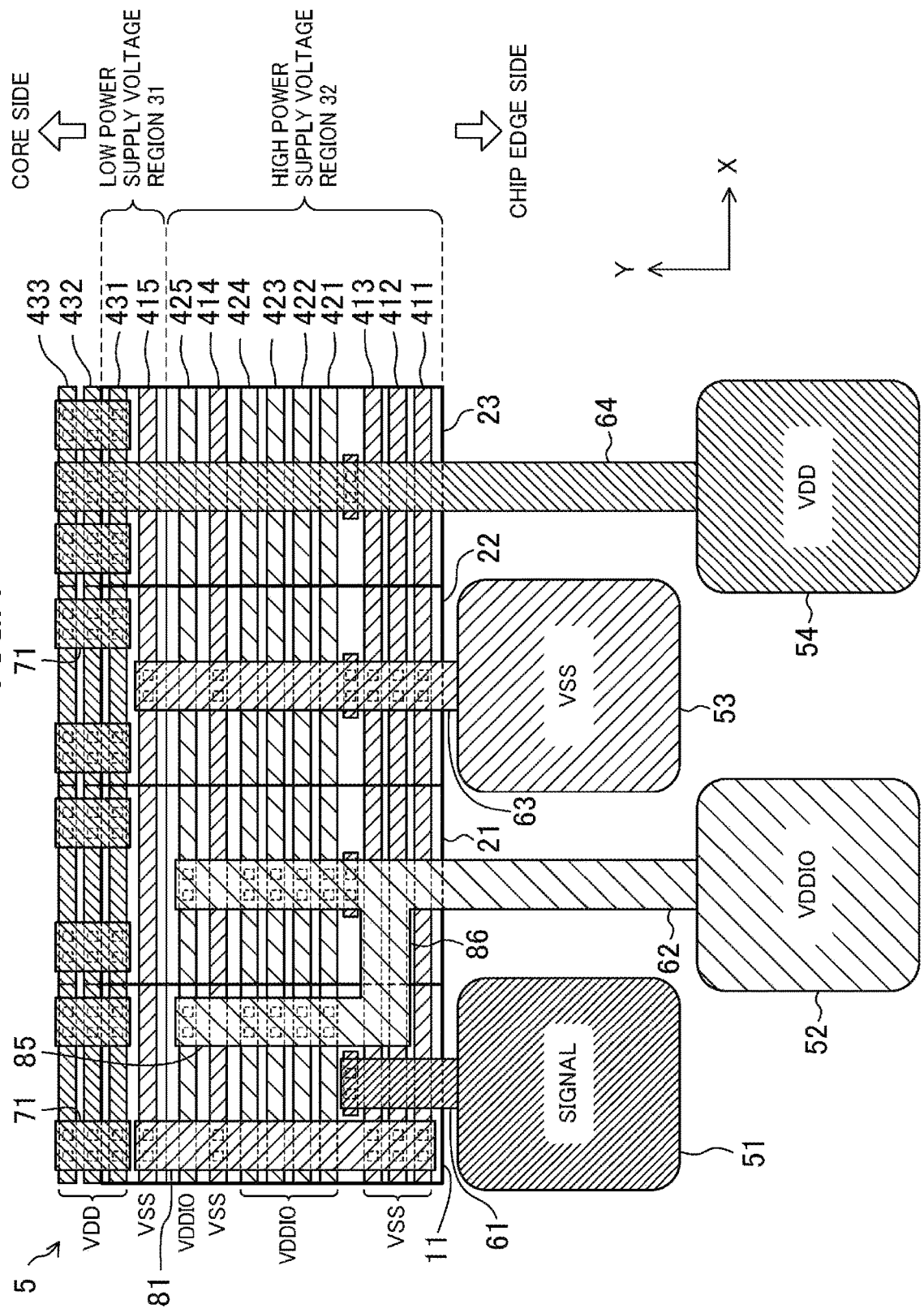
FIG. 4 is a plan view showing a configuration example of an IO region in the second embodiment.

FIG. 4 is a plan view showing a configuration example of the IO region 3 of the semiconductor integrated circuit device 100 according to the second embodiment, which corresponds to an enlarged view of part W in FIG. 1. The configuration example of FIG. 4 is substantially the same as the configuration example of FIG. 2. Therefore, common components are denoted by the same reference characters as in FIG. 2, and detailed description thereof is omitted here in some cases.

In the configuration example of FIG. 4, the reinforcing line 82 mutually connecting the power supply lines 411 to 415 for supply of VSS is omitted, and instead a reinforcing line 85 (corresponding to a third reinforcing line) mutually connecting the power supply lines 421 to 425 for supply of VDDIO is provided. The reinforcing line 85 is connected, through a line 86 extending in the X direction, with the line 62 connecting the external connection pad 52 and the IO power supply IO cell 21.

According to this embodiment, the VDDIO power supply lines are reinforced by the reinforcing line 85 provided in the signal IO cell 11. This makes it possible to prevent a drop in power supply voltage VDDIO. The reinforcing line 85 does not have to be connected with the external connection pad 52. However, by connecting the reinforcing line 85 with the external connection pad 52, the effect of preventing a drop in power supply voltage VDDIO becomes greater.

The reinforcing line 81 for reinforcing VSS and the reinforcing line 85 for reinforcing VDDIO may be placed in the same wiring layer or in different wiring layers from each other.

Although the VDD power supply lines, the VSS power supply lines, and the VDDIO power supply lines extending in the X direction are provided in the same wiring layer in the above embodiments, they may be provided in different wiring layers. Also, each type of the power supply lines may be constituted by a single wiring layer or a plurality of wiring layers. The number of lines constituting each type of the VDD power supply lines, the VSS power supply lines, and the VDDIO power supply lines is not limited to that described in the above embodiments. For example, each may be constituted by one line or by a given number of lines.

Although the reinforcing lines extending in the Y direction are provided in the same wiring layer in the above embodiments, they may be provided in different wiring layers. Also, each type of the reinforcing lines may be constituted by a single wiring layer or a plurality of wiring layers. Note however that the lowermost layer of the reinforcing lines should be located above the uppermost layer of the power supply lines extending in the X direction. The number of lines constituting each type of the reinforcing lines is not limited to that described in the above embodiments. For example, while two reinforcing lines are provided in the signal IO cell 11, one reinforcing line, or three or more reinforcing lines, may be provided.

Although two kinds of power supply voltages VDDIO and VDD are supplied in the above embodiments, another kind of power supply voltage may be supplied. In this case, also, VSS power supply lines can be strengthened by providing a reinforcing line for mutually connecting a VSS power supply line in the low power supply voltage region and a VSS power supply line in the high power supply voltage region.

Other Configuration Example of IO Region

Figure 5:
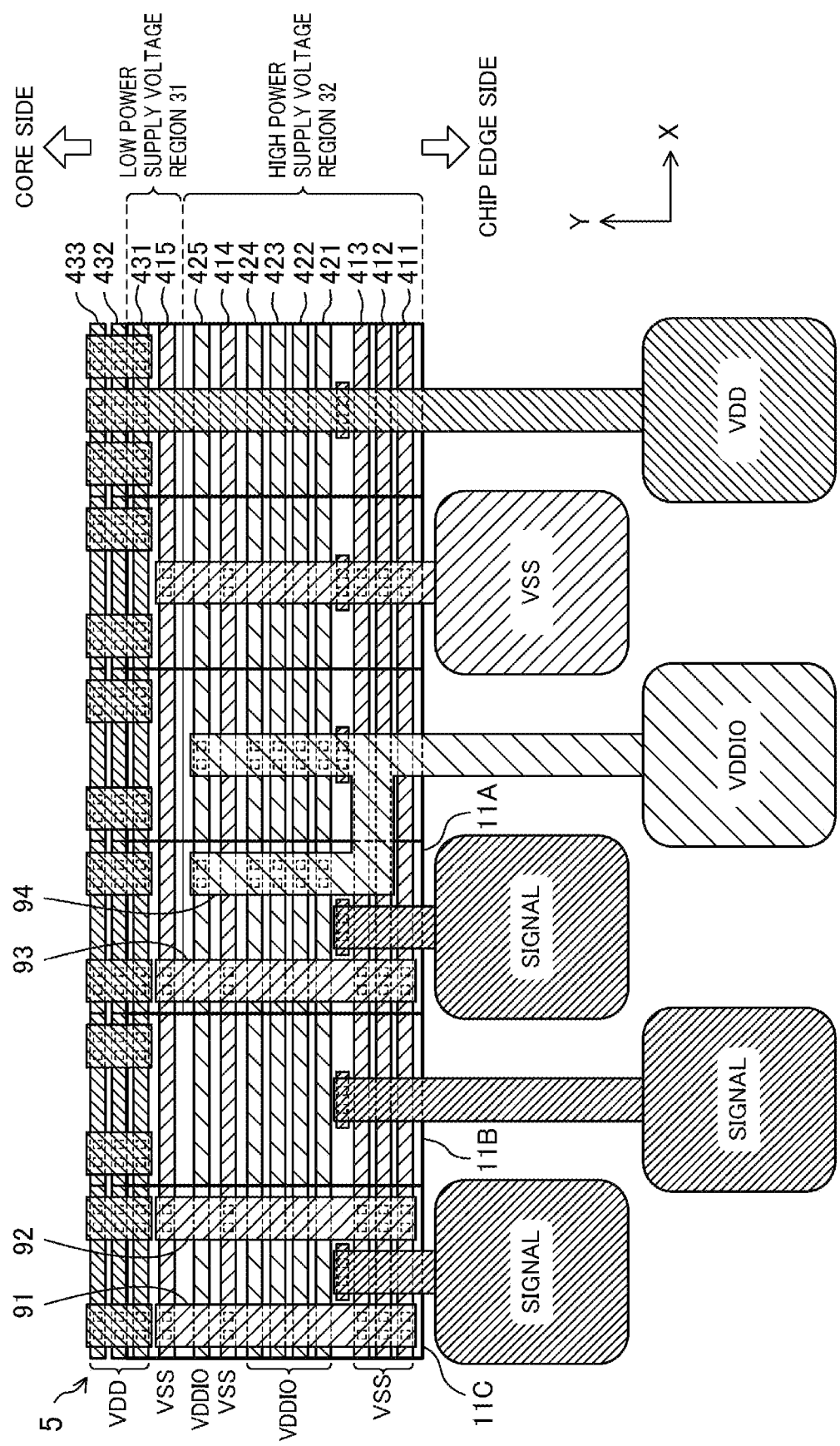
FIG. 5 is a plan view showing another configuration example of the IO region.

FIG. 5 is a plan view showing another configuration example of the IO region 3 of the semiconductor integrated circuit device 100. In the configuration example of FIG. 5, three signal IO cells 11A, 11B, and 11C are provided. In the signal IO cell 11C, provided are reinforcing lines 91 and 92 that mutually connect the power supply lines 411 to 415 for supply of VSS, as in the first embodiment. In the signal IO cell 11A, provided are a reinforcing line 93 that mutually connects the power supply lines 411 to 415 for supply of VSS and a reinforcing line 94 that mutually connects the power supply lines 421 to 425 for supply of VDDIO, as in the second embodiment. In the signal IO cell 11B, however, no reinforcing line is provided. As in this example, it is acceptable for the IO cell row 5 to include a signal IO cell having a reinforcing line for VSS power supply lines, a signal IO cell having a reinforcing line for VSS power supply lines and a reinforcing line for VDDIO power supply lines, and a signal IO cell having no reinforcing line for power supply lines in a mixed manner.

Although the IO cell row 5 is provided around the entire periphery of the semiconductor integrated circuit device 100 in the above embodiments, the placement is not limited to this. For example, the IO cell row 5 may be provided on part of the periphery of the semiconductor integrated circuit device 100. Also, it is not necessary to apply the configurations of the present embodiments to the entire of the IO cell row 5, but only necessary to apply them to some area of the IO cell row 5.

According to the present disclosure, in the semiconductor integrated circuit device provided with IO cells, it is possible to strengthen power supply lines while preventing increase in area. The present disclosure is therefore useful for improvement in the performance of LSI, for example.

What is claimed is:

1. A semiconductor integrated circuit device, comprising:
    a chip;
    a core region provided on the chip;
    an IO region provided between the core region and a periphery of the chip on the chip;
    an IO cell row placed in the IO region, constituted by a plurality of IO cells arranged in a first direction, the first direction being a direction along the periphery of the chip; and
    power supply lines placed in the IO region, extending in the first direction, wherein
    the plurality of IO cells each have a low power supply voltage region and a high power supply voltage region separated in a second direction perpendicular to the first direction, the low power supply voltage region being located closer to the core region,
    the power supply lines includes:
        a first power supply line extending in the first direction in the low power supply voltage region, for supply of a first power supply voltage,
        a second power supply line extending in the first direction in the low power supply voltage region and located father from the core region than the first power supply line, for supply of a second power supply voltage, the second power supply voltage being lower than the first power supply voltage,
        a third power supply line extending in the first direction in the high power supply voltage region and located farther from the core region than the second power supply line, for supply of the second power supply voltage, and
        a fourth power supply line extending in the first direction in the high power supply voltage region, and located farther from the core region than the second power line and nearer the core region than the third power supply line, for supply of a third power supply voltage, the third power voltage being higher than the first power supply voltage,
    the first, second, third and fourth power supply lines are provided in a first wiring layer,
    the first power supply line has a first portion protruding from the low power supply voltage region to the core region, and
    a first IO cell as a signal IO cell among the plurality of IO cells has a first reinforcing line extending in the second direction in a second wiring layer located above the first wiring layer, for mutually connecting the second and third power supply lines.

2. The semiconductor integrated circuit device of claim 1, wherein
    the first portion of the first power supply line overlaps a transistor placed in the core region as viewed from top.

3. The semiconductor integrated circuit device of claim 1, wherein
    the first power supply line is constituted by a plurality of lines extending in the first direction, the plurality of lines being arranged in the second direction, and
    a second reinforcing line is provided to extend in the second direction in the second wiring layer for mutually connecting the plurality of lines constituting the first power supply line.

4. The semiconductor integrated circuit device of claim 1, wherein
    the power supply lines include a fifth power supply line extending in the first direction in the high power supply voltage region, provided in the first wiring layer, located farther from the core region than the third power supply line, for supply of the third power supply voltage, and
    the first IO cell has a third reinforcing line extending in the second direction in the second wiring layer, for mutually connecting the fourth power supply line and the fifth power supply line.

5. The semiconductor integrated circuit device of claim 1, wherein
    the thickness of the first reinforcing line is greater than that of the second and third power supply lines.

* * * * *